United States Patent [19]
Dickerson

[11] Patent Number: 5,263,191
[45] Date of Patent: Nov. 16, 1993

[54] METHOD AND CIRCUIT FOR PROCESSING AND FILTERING SIGNALS

[75] Inventor: Roger W. Dickerson, Montgomery, Ohio

[73] Assignee: Westinghouse Electric Corp., Pittsburgh, Pa.

[21] Appl. No.: 806,058

[22] Filed: Dec. 11, 1991

[51] Int. Cl.$^5$ .................................................. H04B 1/10
[52] U.S. Cl. ...................................... 455/304; 455/65; 375/99; 307/529; 307/542; 328/165
[58] Field of Search ................. 375/102, 104, 99, 100, 375/14; 328/162, 165, 164, 264; 360/38.1; 358/314; 329/320; 455/295, 296, 65, 304; 307/556, 542

[56] References Cited

U.S. PATENT DOCUMENTS

| | | | |
|---|---|---|---|
| 3,693,100 | 9/1972 | Brown et al. | 328/165 |
| 4,210,933 | 7/1980 | Heitmann | 328/165 |
| 4,238,746 | 12/1980 | McCool et al. | 333/166 |
| 4,669,091 | 5/1992 | Nossen | 455/65 |
| 4,726,035 | 2/1988 | Bullock et al. | 375/14 |
| 4,726,036 | 2/1988 | Sawyer et al. | 375/14 |

Primary Examiner—Reinhard J. Eisenzopf
Assistant Examiner—Mark D. Wisler
Attorney, Agent, or Firm—R. P. Lenart

[57] ABSTRACT

A method for processing electrical signals includes the steps of: storing a plurality of first digital data signals each representative of an instantaneous amplitude of a first input signal in a memory; selecting one of the first digital data signals in response to a second input signal; combining the selected one of the first digital data signals with a second digital data signal representative of a subsequent instantaneous amplitude of the first input signal, to produce a digital difference signal; producing a first output signal in response to the digital difference signal; and combining the digital difference signal and the selected first digital data signal to produce a modified digital data signal and for replacing the selected one of the first digital data signals with the modified digital data signal in the memory. The method can be performed by an equalizer in a circuit for compensating for amplitude variations in a radio frequency signal or by a comb notch filter. The invention also encompasses circuits which perform the above signal processing method.

17 Claims, 4 Drawing Sheets

METHOD AND CIRCUIT FOR PROCESSING AND FILTERING SIGNALS

BACKGROUND OF THE INVENTION

This invention relates to methods and circuits for processing and filtering signals. Such methods and circuits can be particularly adapted to reduce amplitude variations in angle modulated radio frequency signals, or to provide comb notch filtering that removes interference of a repetitive nature.

Multipath phenomena results from multiple paths taken by a transmitted radio frequency signal before the signal reaches a receiver. Transmission of the signal along these paths results in constructive and destructive interference which causes amplitude variations that are a function of the signal's instantaneous frequency. These variations in amplitude complicate subsequent signal processing. For example, in the reception of radio frequency signals, a situation is frequently encountered in which a weak signal of interest (SOI) is subject to interference by a strong interfering signal having a frequency band which encompasses that of the SOI. The interfering signal may be, for example, a jamming signal or a commercial radio or television signal. If the interfering signal is an angle modulated signal, variations in amplitude whether caused by multipath phenomena or otherwise, can further mask the signal of interest, making detection of the signal of interest more difficult.

Interference of a repetitive nature can also cause harmonic interference, in which case it is desirable to remove the harmonic components of a signal. A comb notch filter may be used for such purposes.

The present invention seeks to provide a method and circuit for processing radio frequency signals to filter the signals or to remove the effects of amplitude variations wherein the amplitude variations are correlated with the instantaneous frequency of the signal.

SUMMARY OF THE INVENTION

A circuit for processing electrical signals 10 constructed in accordance with this invention includes: a memory having a plurality of addresses for storing a plurality of first digital data signals, each representative of an instantaneous amplitude of a first input signal; means for selecting one of the first digital data signals in response to a second input signal; means for combining the selected one of the first digital data signals with a second digital data signal representative of a subsequent instantaneous amplitude of the first input signal, to produce a digital difference signal; means for producing a first output signal in response to the digital difference signal; and means for combining the digital difference signal and the selected one of the first digital data signals to produce a modified digital data signal and for replacing the selected first digital data signal with the modified digital data signal in the memory.

The above circuit can serve as a part of a circuit for removing the effects of amplitude variations in a radio frequency signal, constructed in accordance with this invention which comprises: a memory having a plurality of addresses for storing a plurality of first digital data signals, each representative of an instantaneous amplitude of a first input signal, wherein the amplitude variations are correlated with the instantaneous frequency of the signal; a first analog to digital converter for producing an address signal for selecting one of the first digital data signals in response to a first input signal, the first input signal being correlated with the interfering signal; a first adder for combining the selected one of the first digital data signals with a second digital data signal representative of a subsequent instantaneous amplitude of the composite signal, to produce a digital difference signal; a first digital to analog converter for producing a first analog output signal in response to the digital difference signal; and a second adder for combining the digital difference signal and the selected one of the first digital data signal to produce a modified digital data signal and for replacing the selected first digital data signal with the modified digital data signal in the memory.

The invention also includes a method for processing electrical signals comprising the steps of: providing a memory having a plurality of addresses for storing a plurality of first digital data signals, each representative of an instantaneous amplitude of a first input signal; selecting one of the first digital data signals in response to a second input signal; combining the selected one of the first digital data signals with a second digital data signal representative of a subsequent instantaneous amplitude of the first input signal, to produce a digital difference signal; producing a first output signal in response to the digital difference signal; and combining the digital difference signal and the selected first digital data signal to produce a modified digital data signal and for replacing the selected one of the first digital data signals with the modified digital data signal in the memory.

The invention further encompasses the method for compensating for amplitude variations in an angle modulated radio frequency signal, performed by the above circuit, comprising the steps of: providing a memory having a plurality of addresses for storing a plurality of first digital data signals, each representative of an instantaneous amplitude of a composite signal, wherein the composite signal includes a signal of interest and an interfering signal; selecting one of the first digital data signals in response to a first input signal, the first input signal being correlated with the interfering signal; combining the selected one of the first digital data signals with a second digital data signal representative of a subsequent instantaneous amplitude of the composite signal, to produce a digital difference signal; producing a first analog output signal in response to the digital difference signal; combining the digital difference signal and the selected one of the first digital data signals to produce a modified digital data signal; and replacing the selected first digital data signal with the modified digital data signal in the memory.

BRIEF DESCRIPTION OF THE DRAWINGS

The invention will become more readily apparent to those skilled in the art through the following description of the preferred embodiment thereof, as illustrated in the drawings, wherein.

DESCRIPTION OF THE PREFERRED EMBODIMENT

Figure 1:
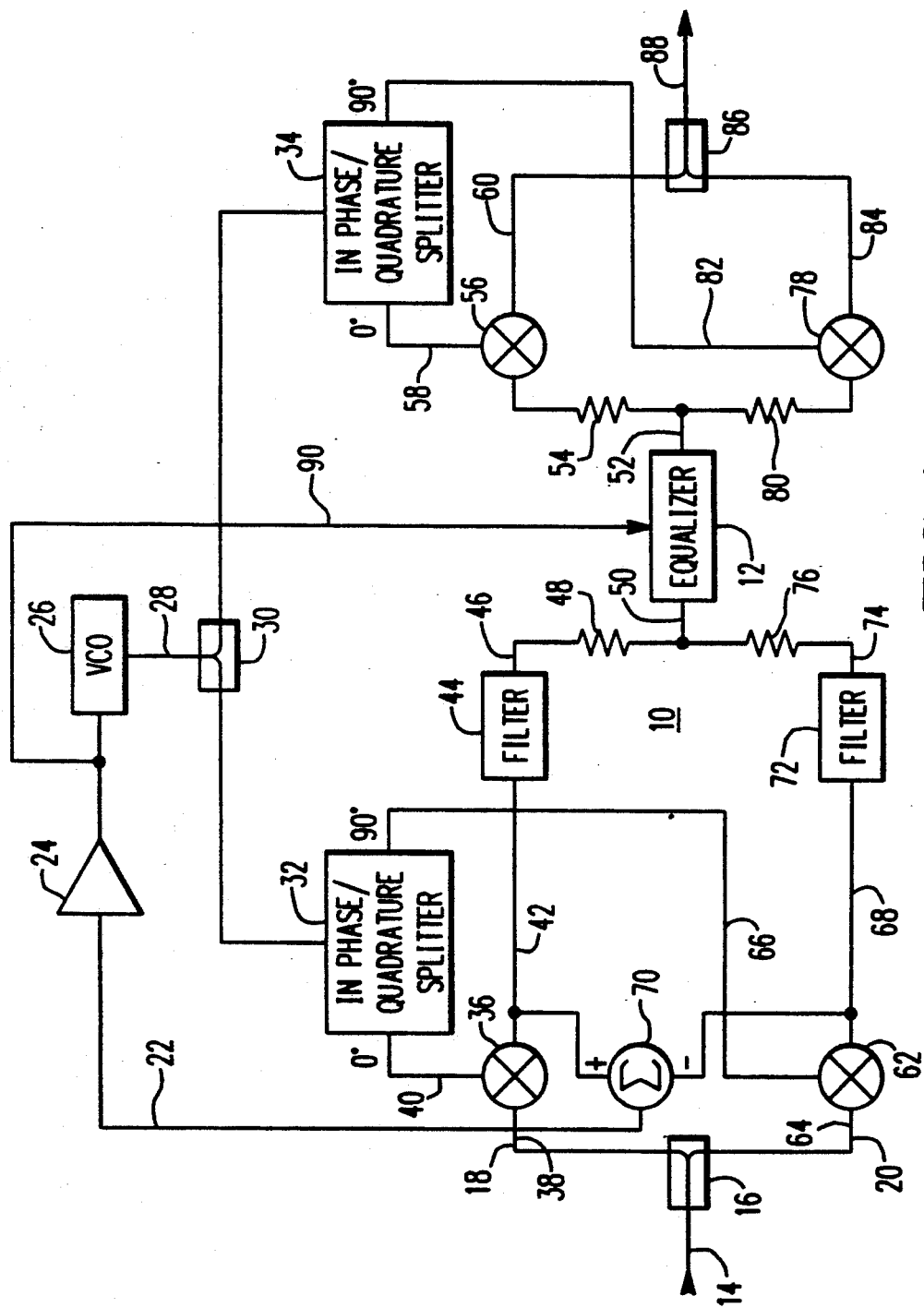
FIG. 1 is a block diagram of an interference suppression circuit which includes an equalization circuit constructed in accordance with this invention.

Referring to the drawings, FIG. 1 is a block diagram of an interference suppression circuit 10, having an equalization circuit 12 constructed in accordance with this invention. The circuit of FIG. 1 provides non-cooperative suppression of high-level interference signals to enhance the detection of a co-channel low-level signal of interest (SOI). In this context, non-cooperative suppression refers to suppression of an interfering signal which does not require a reference sample of the interfering signal. The circuit operates on an interference corrupted signal to produce an enhanced version of the desired SOI. The circuit of FIG. 1 can be readily retrofitted within the intermediate frequency (IF) stage of existing receiver systems.

A composite signal, including both an angle modulated interfering signal (I) and a signal of interest (SOI) is supplied to the interference suppression circuit 10 by way of input line 14. A signal splitter 16 splits the composite signal and delivers it to a first channel 18 and a second channel 20. An error signal on line 22 is amplified by amplifier 24 and used by a voltage controlled oscillator 26 to produce a reference signal on line 28. The reference signal on line 28 is split by a splitter 30 and sent to first and second in-phase/quadrature splitters 32 and 34, respectively. The in-phase/quadrature splitters produce a first output which is the in phase component of the reference signal (0 degrees) and a second output which is the quadrature component of the reference signal (90 degrees). A first mixer 36 mixes the composite signal on line 38 with the in phase component of the reference signal on line 40 to produce a first compound signal on line 42. A filter 44 removes selected components of the first compound signal to produce a first filtered signal on line 46. The filtered signal is delivered via resistor 48 to line 50 where it is combined with a second filtered signal from filter 72 and passed to equalization circuit 12. The equalization circuit produces a modified signal on line 52 which is delivered via resistor 54 to a second mixer 56. The second mixer mixes the modified signal on line 54 with an in phase component of the reference signal on line 58 to produce a second compound signal on line 60.

A third mixer 62 mixes the composite signal on line 64 with a quadrature component of the reference signal on line 66 to produce a third compound signal on line 68. The error signal on line 22 is the difference in voltage of the first and third compound signals as produced at the output of summation point 70. A second filter 72, which is matched to filter 44, removes selected components of the third compound signal and produces the second filtered signal on line 74. The second filtered signal is combined with the first filtered signal and delivered to the equalization circuit 12 via resistor 76 and line 50. A fourth mixer 78 receives the modified signal on line 52, via resistor 80 and mixes the modified signal with a quadrature component of the reference signal on line 82 to produce a fourth compound signal on line 84. The second and fourth compound signals are combined by combiner 86 to produce an output signal on line 88. The spectral power density of the signal of interest in the output signal is greater than the spectral power density of the interfering signal in the output signal. Therefore the signal of interest in the output signal can be easily captured by well known signal capture circuits. The amplified error signal on line 90 is correlated with the interfering signal portion of the first and second filtered signals. This correlated signal is used to select addresses in a memory of the equalizer as is discussed below.

The circuit of FIG. 1 is particularly directed to those instances where the angle modulated interfering signal (I) has a constant envelope with a bandwidth encompassing that of the signal of interest (SOI). The interfering signal may have an inherent amplitude variation which is dependent upon the amount of angle modulation, and will have additional amplitude variation due to multipath phenomena. This amplitude variation is relatively well defined. The circuit of FIG. 1 is provided as an example of the type of circuit which can benefit from the addition of the equalization circuit of this invention. A detailed description of the operation of the circuit of FIG. 1 is not required in order to practice the present invention, since the invention can be applied to a wide variety of circuits in which an angle modulated signal is subject to undesired amplitude variations.

Figure 2:
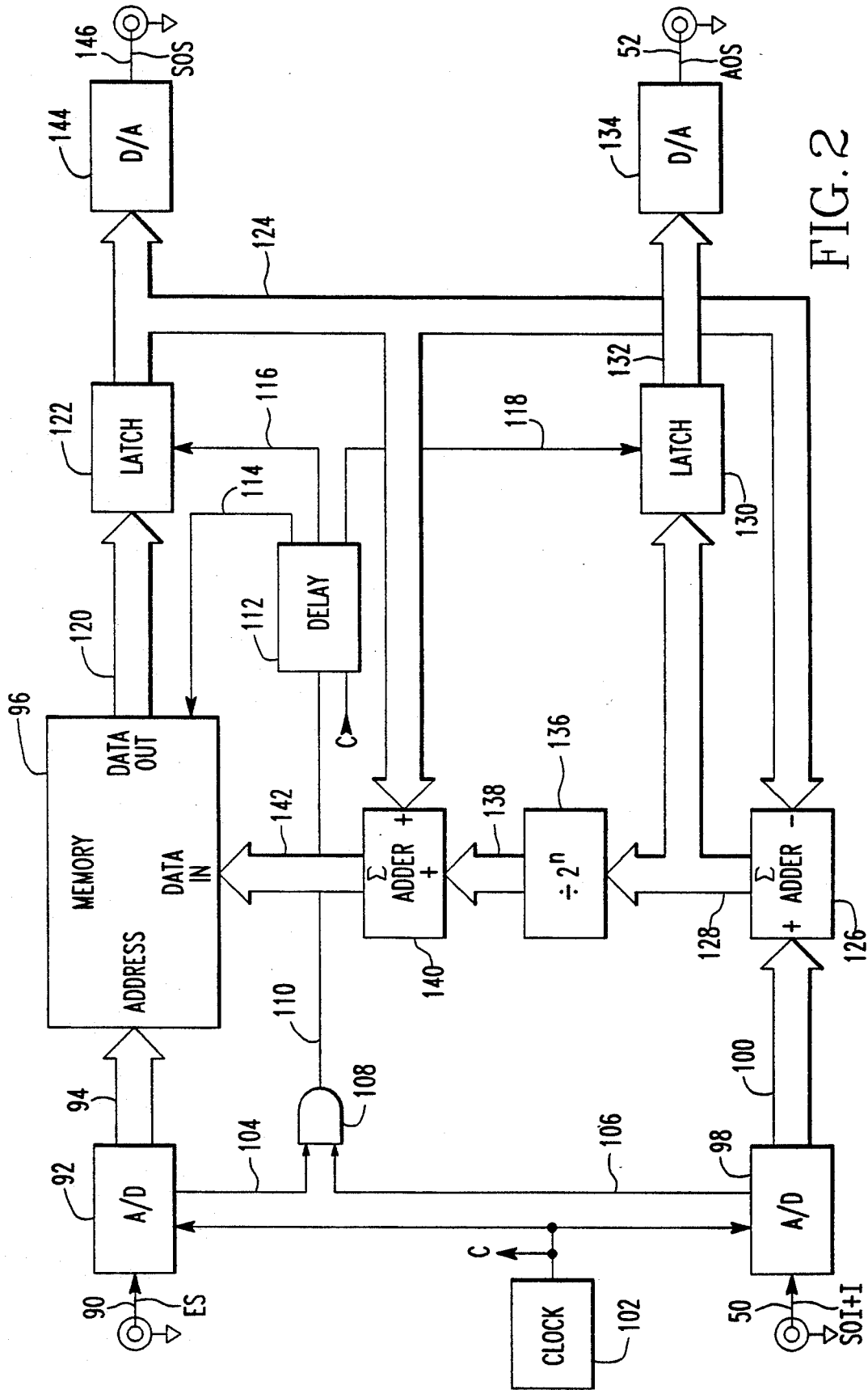
FIG. 2 is a block diagram of the equalization circuit of FIG. 1.

FIG. 2 is a block diagram of an equalization circuit constructed in accordance with this invention, and suitable for use as the equalization circuit in FIG. 1. Circuits constructed in accordance with the equalization circuit of FIG. 2 estimate the amplitude variation signature in the interfering signal and subtract it from the filtered signals to reduce the amount of amplitude variation in the resulting modified filtered signal. The estimation is accomplished by repeatedly sampling the input signal and combining the sampled value with a previously stored value to obtain an updated value which replaces the previously stored value. The updated value is typically closer to the previously stored value than the sampled value. In FIG. 2, a first analog to digital converter 92 receives the error signal (ES) on line 90. The error signal is correlated with an interfering signal wherein the interfering signal is one component of a composite signal on line 50. The composite signal on line 50 also includes a signal of interest. Analog to digital converter 92 produces a digital output signal, representative of the instantaneous amplitude of the signal on line 90, on data bus 94. The data signal on line 94 is used to select an address in memory 96. As is explained below, memory 96 includes a plurality of addresses for storing first digital data signals which are representative of the previous values of the composite signal.

A second analog to digital converter 98 receives the composite signal, including both the interfering signal (I) and the signal of interest (SOI) on line 50, and produces a digital output signal on line 100 that is representative of the instantaneous value of the composite signal. Clock 102 controls the sequence of operations performed by the circuit of FIG. 2. In response to a predetermined change in polarity of the output pulses of clock 102, analog to digital converters 92 and 98 produce their respective output signals. The analog to digital converters also produce data ready signals on lines 104 and 106. These data ready signals are received by AND gate 108 and used to produce a voltage pulse on line 110. The voltage pulse on line 110 passes to delay circuit 112, which may be a shift register. Delay circuit 112 then produces output pulses on lines 114, 116 and 118. The first data signal is selected by the address identified by the signal on bus 94, and read out onto bus 120. Alternatively, selection of the first data signal may be done utilizing a software loop. The selected signal is then frozen by latch 122, which is controlled by a pulse on line 116. The frozen signal on bus 124 is delivered to adder 126 where it is subtracted from the signal on bus 100 to produce a digital difference signal on bus 128. Latch 130 freezes the digital difference signal on bus 132 in response to a voltage pulse on line 118. A first digital to analog converter 134 converts the digital signal on bus 132 to an analog output signal (AOS) on line 52. When this circuit is used in the circuit of FIG. 1, the output signal from digital to analog converter 134 is the modified filtered signal.

Scaling circuit 136 divides the digital difference signal on bus 128 by a preselected number to produce an incremental adjustment signal on bus 138. The incremental adjustment signal on bus 138 is then added to the first digital data signal on bus 124 by adder 140 to obtain a modified digital data signal on bus 142. A pulse on line 114 enables memory 96 to replace the selected first digital data signal previously read from the memory with the digital data signal on bus 142 at the address identified by the signal on bus 94. A second digital to analog converter 144 converts the first digital signal on bus 124 into a second output signal (SOS) on line 146. The second output signal (which is not used by the circuit of FIG. 1) is representative of the interfering signal component of the composite signal.

The circuit of FIG. 2 uses a successive estimation technique to update the data in the memory so that the stored data approaches an accurate representation of the amplitude variation of the interfering signal. The amount by which the values of the stored data are adjusted (attack rate) is controlled by changing the value of the divisor in scaling circuit 136. The input signal on line 50 is a composite signal which includes a signal of interest and an undesired interfering signal, wherein the signal of interest can be considered to be a deviation from the average of the composite signal. The input signal on line 90 is a signal which is correlated with the interfering signal. The output signal on line 52 is an uncorrelated amplitude modulated signal which is representative of the signal of interest. The output signal on line 146 is a correlated amplitude modulated signal representative of the interfering signal.

It should be apparent that this invention can enhance the interception of low-level signals of interest in the presence of strong interference by reducing the interference due to amplitude variations in the interfering signal which tend to mask the signal of interest. The invention is also useful in circuits used to suppress co-site/co-channel interference in tactical and strategic communications systems.

Where the distorted version of interfering signal Y, present on line 50 or bus 100, can be represented as a polynomial of the form:

$$Y = \sum_{n=0}^{\infty} C_n X^n$$

where X is the interfering signal or value on line 90 or bus 94. The circuits of this invention learn the coefficients $C_n$ of the terms of the polynomial and subtract those terms from the composite signal, within the limits of the digital quantization. This is accomplished by using a memory having individual bins for each level of the interfering signal, thereby permitting each level to be handled separately.

Figure 3:
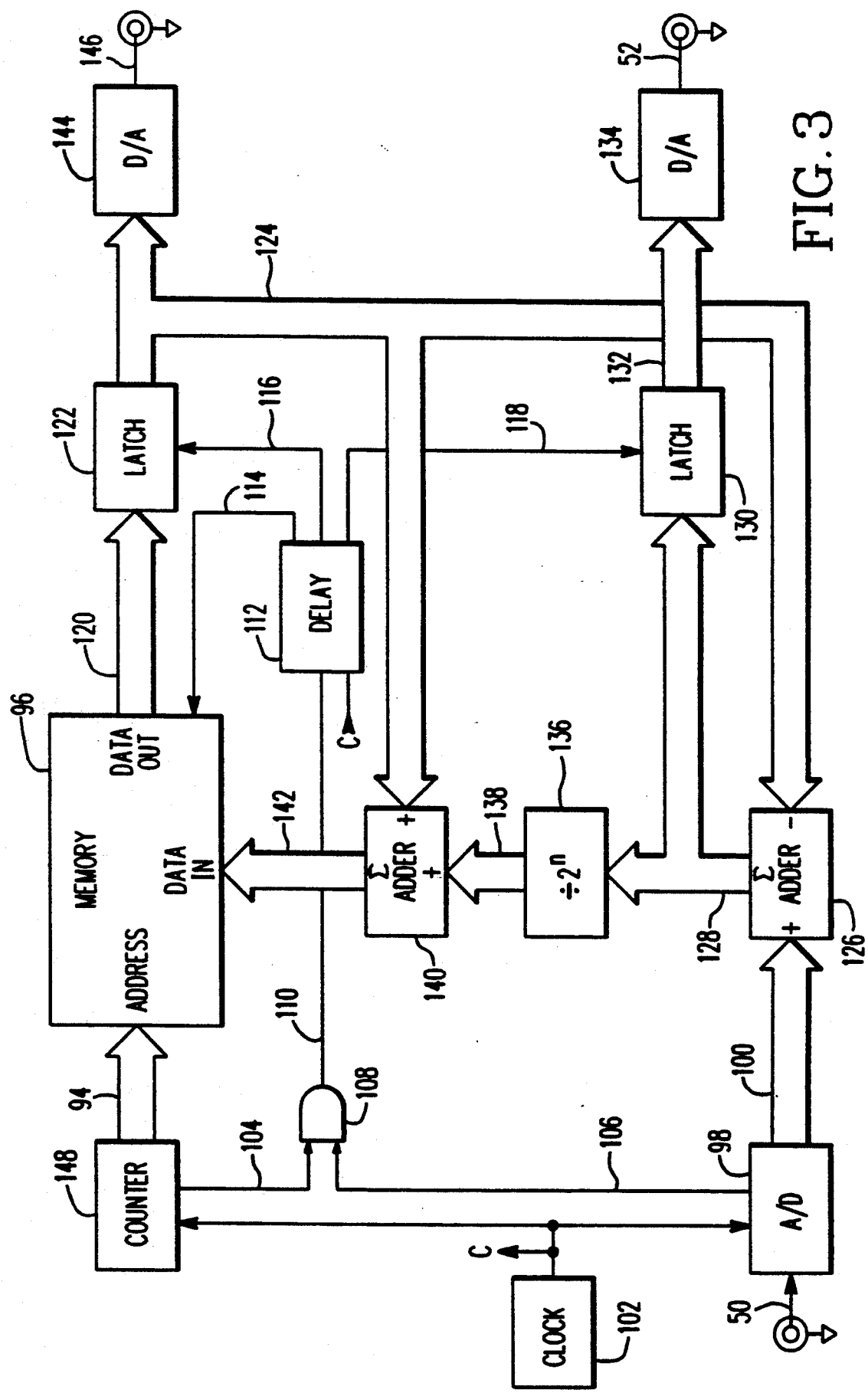
FIG. 3 is a block diagram of a filter circuit constructed in accordance with this invention.
Figure 4:
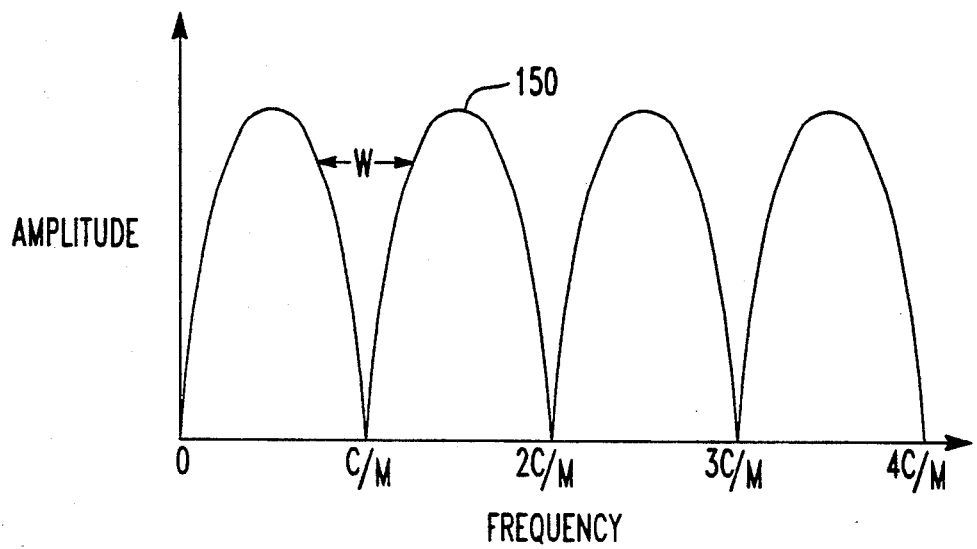
FIGS. 4 and 5 are diagrams which illustrate the operation of the filter of FIG. 3.
Figure 5:
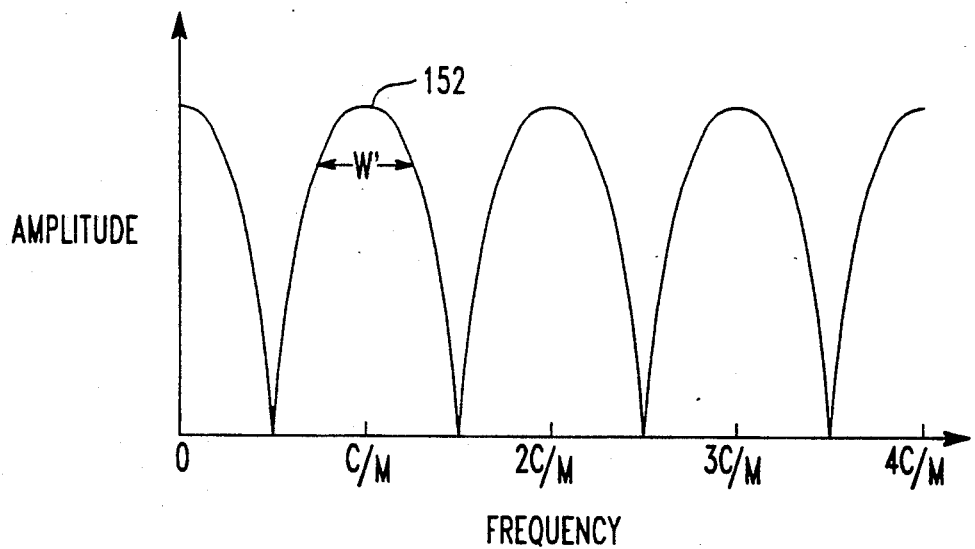

FIG. 3 is a block diagram of a comb notch filter which uses the circuit of this invention. This circuit is similar to the circuit of FIG. 2 except that the analog to digital converter 91 in FIG. 2 has been replaced by a counter 144. The signal to be filtered is applied to input line 50. Clock 102 controls the sampling rate of analog to digital converter 98 and also increments the counter to provide an address location on bus 94. With this configuration, the output on line 52 is an uncorrelated notched output and is illustrated in FIG. 4, wherein C is the clock frequency and M is the maximum address on the data bus 94. The amplitude in FIG. 4 is the ratio of the amplitudes of the signals on line 52 and 50. The width of the notch W is directly proportional to the C/M ratio and inversely proportional to $2_n$. The output on line 146 is a correlated bandpass output and is illustrated in FIG. 5, wherein C is the clock frequency and M is the maximum address on the data bus 94. The amplitude in FIG. 5 is the ratio of the amplitudes of the signals on lines 146 and 50. The width of the bandpass $W^1$ is directly proportional to the C/M ratio and inversely proportional to $2_n$.

Although the invention has been described in terms of its preferred embodiments, it will be apparent to those skilled in the art that various changes may be made without departing from the scope of the invention. It is therefore intended that the appended claims cover such changes.

What is claimed:

1. A circuit for processing electrical signals comprising:
    a memory having a plurality of addresses for storing a plurality of first digital data signals, each representative of an instantaneous amplitude of a first input signal;
    means for selecting one of said first digital data signals in response to a second input signal;
    means for combining the selected one of said first digital data signals with a second digital data signal representative of an additional instantaneous amplitude of said first input signal, to produce a digital difference signal;
    means for producing a first output signal in response to said digital difference signal; and
    means for combining said digital difference signal and the selected one of said first digital data signals to produce a modified digital data signal and for replacing the selected one of said first digital data signals with said modified digital data signal in said memory.

2. A circuit for processing electrical signals according to claim 1, wherein:
    the first input signal includes a signal of interest and an interfering signal; and
    said interfering signal being correlated with said second input signal.

3. A circuit for processing electrical signals according to claim 1, further comprising:
    means for producing a second output signal in response to the selected one of said digital data signals.

4. A circuit for processing electrical signals according to claim 1, wherein said means for combining said digital difference signal and the selected one of said first digital data signals to produce a modified digital data signal and for replacing the selected one of said first digital data signals with said modified digital data signal in said memory, comprises:
    a scaling circuit for dividing said digital difference signal by a preselected number to produce a correction signal; and an adder adding said correction signal to the selected first digital data signal to produce said modified digital data signal.

5. A circuit for processing electrical signals according to claim 1, wherein said means for selecting one of said first digital data signals in response to a second input signal comprises:
a counter for producing said second input signal in response to a clock signal.

6. A method for processing electrical signals comprising the steps of:
providing a memory having a plurality of addresses for storing a plurality of first digital data signals, each representative of an instantaneous amplitude of a first input signal;
selecting one of said first digital data signals in response to a second input signal;
combining the selected one of said first digital data signals with a second digital data signal representative of an additional instantaneous amplitude of said first input signal, to produce a digital difference signal;
producing a first output signal in response to said digital difference signal; and
combining said digital difference signal and the selected one of said first digital data signals to produce a modified digital data signal and replacing the selected one of said first digital signals with said modified digital data signal in said memory.

7. A method for processing electrical signals according to claim 6, wherein
the first input signal includes a signal of interest and an interfering signal; and
said interfering signal is correlated with said second input signal.

8. A method for processing electrical signals according to claim 6, further comprising the step of:
producing a second output signal in response to the selected one of said digital data signals.

9. A method for processing electrical signals according to claim 6, wherein said step of combining said digital difference signal and the selected one of said first digital data signals to produce a modified digital data signal and for replacing the selected one of said first digital data signals with said modified digital data signal in said memory, comprises the steps of:
dividing said digital difference signal by a preselected number to produce a correction signal; and
adding said correction signal to the selected one of said first digital data signals to produce said modified digital data signal.

10. A circuit for compensating for amplitude variation in an angle modulated composite signal comprising:
a memory having a plurality of addresses for storing a plurality of first digital data signals, each representative of an instantaneous amplitude of the composite signal, wherein the composite signal includes a signal of interest and an interfering signal;
means for selecting one of said first digital data signals in response to a first input signal, said interfering signal being correlated with said first input signal;
means for combining the selected one of said first digital data signals with a second digital data signal representative of an additional instantaneous amplitude of said composite signal, to produce a digital difference signal;
means for producing a first analog output signal in response to said digital difference signal; and
means for combining said digital difference signal and the selected one of said first digital data signals to produce a modified digital data signal and for replacing the selected one of said first digital data signals with said modified digital data signal in said memory.

11. A circuit for compensating for amplitude variation in an angle modulated composite signal according to claim 10, further comprising:
means for producing a second output signal in response to the selected one of said digital data signals.

12. A circuit for compensating for amplitude variation in an angle modulated composite signal according to claim 10, wherein said means for combining said digital difference signal and the selected one of said first digital data signals to produce a modified digital data signal and for replacing the selected one of said first digital data signals with said modified digital data signal in said memory, comprises:
a scaling circuit for dividing said digital difference signal by a preselected number to produce a correction signal; and
an adder adding said correction signal to the selected one of said first digital data signals to produce said modified digital data signal.

13. A circuit for compensating for amplitude variation in an angle modulated composite signal comprising:
a memory having a plurality of addresses for storing a plurality of first digital data signals, each representative of an instantaneous amplitude of the composite signal, wherein the composite signal includes a signal of interest and an interfering signal;
a first analog to digital converter producing an address signal for selecting one of said first digital data signals in response to a first input signal, said first input signal being correlated with said interfering signal;
a first adder for combining the selected one of said first digital data signals with a second digital data signal representative of an additional instantaneous amplitude of said composite signal, to produce a digital difference signal;
a first digital to analog converter for producing a first analog output signal in response to said digital difference signal; and
a second adder for combining said digital difference signal and the selected one of said first digital data signals to produce a modified digital data signal and for replacing the selected one of said first digital data signals with said modified digital data signal in said memory.

14. A circuit for compensating for amplitude variation in an angle modulated composite signal according to claim 13, further comprising:
a second digital to analog converter for producing a second output signal in response to the selected one of said digital data signals.

15. A method for compensating for amplitude variation in an angle modulated composite signal, said method comprising the steps of:
providing a memory having a plurality of addresses for storing a plurality of first digital data signals, each representative of an instantaneous amplitude of the composite signal, wherein the composite signal includes a signal of interest and an interfering signal;

selecting one of said first digital data signals in response to a first input signal, said first input signal being correlated with said interfering signal;

combining the selected one of said first digital data signals with a second digital data signal representative of an additional instantaneous amplitude of said composite signal, to produce a digital difference signal;

producing a first analog output signal in response to said digital difference signal;

combining said digital difference signal and the selected one of said first digital data signals to produce a modified digital data signal; and replacing the selected one of said first digital data signals with said modified digital data signal in said memory.

16. A method for compensating for amplitude variation in an angle modulated composite signal according to claim 15, further comprising the step of:

producing a second output signal in response to the selected one of said digital data signals.

17. A method for compensating for amplitude variation in an angle modulated composite signal according to claim 5, wherein said step of combining said digital difference signals and the selected one of said first digital data signals to produce a modified digital data signal, comprises the steps of:

dividing said digital difference signal by a preselected number to produce a correction signal; and adding said correction signal to the selected one of said first digital data signals to produce said modified digital data signal.

* * * * *